(12) United States Patent
Sweeney et al.

(10) Patent No.: US 10,326,036 B2
(45) Date of Patent: Jun. 18, 2019

(54) DEVICE WITH A QUANTUM WELL LAYER

(71) Applicant: ASTRIUM LIMITED, Stevanage Hertfordshlire (GB)

(72) Inventors: Stephen Sweeney, Stevenage (GB); Yaping Zhang, Stevenage (GB)

(73) Assignee: ASTRIUM LIMITED, Stevenage, Hertfordshire (GB)

( * ) Notice: Subject to any disclaimer, the term of this patent is extended or adjusted under 35 U.S.C. 154(b) by 0 days.

(21) Appl. No.: 15/636,775

(22) Filed: Jun. 29, 2017

(65) Prior Publication Data

US 2017/0309763 A1   Oct. 26, 2017

Related U.S. Application Data

(63) Continuation of application No. 14/351,696, filed as application No. PCT/EP2012/069934 on Oct. 9, 2012, now abandoned.

(30) Foreign Application Priority Data

Oct. 14, 2011   (EP) .................................... 11275125

(51) Int. Cl.
   *H01L 31/0352*   (2006.01)
   *G02B 6/293*   (2006.01)
   (Continued)

(52) U.S. Cl.
   CPC ...... *H01L 31/035236* (2013.01); *B82Y 20/00* (2013.01); *G01J 3/0205* (2013.01);
   (Continued)

(58) Field of Classification Search
   CPC ......... H01L 2924/00; H01L 31/035236; H01L 2924/01322; H01L 2924/12033;
   (Continued)

(56) References Cited

U.S. PATENT DOCUMENTS 6,633,696 B1   10/2003  Vahala et al.
6,865,314 B1    3/2005  Blair et al.
(Continued)

FOREIGN PATENT DOCUMENTS

CN   101741014 A    6/2010
GB   2 470 115 A   11/2010
(Continued)

OTHER PUBLICATIONS

International Search Report (PCT/ISA/210) dated Jan. 16, 2013, by the European Patent Office as the International Searching Authority for International Application No. PCT/EP2012/069956.
(Continued)

*Primary Examiner* — Tony Tran
(74) *Attorney, Agent, or Firm* — Buchanan Ingersoll & Rooney PC

(57) ABSTRACT

A device for guiding and absorbing electromagnetic radiation, the device including: absorbing means for absorbing the electromagnetic radiation; and a coupled to the absorbing means for guiding the electromagnetic radiation to the absorbing means, wherein the waveguide and the absorbing means are formed from a structure including a first cladding layer, a second cladding layer over the first cladding layer, and a quantum-well layer between the first and second cladding layers, the quantum-well layer being formed of a material having a different composition to the first and second cladding layers, wherein the thickness and the composition of the quantum-well layer is optimised to provide an acceptable level of absorption of electromagnetic radiation in the waveguide while providing an appropriate band gap for absorption of the electromagnetic radiation in the absorbing means.

9 Claims, 4 Drawing Sheets

(51) Int. Cl.
  *G01J 3/02* (2006.01)
  *G01J 3/42* (2006.01)
  *G02F 1/017* (2006.01)
  *B82Y 20/00* (2011.01)
  *G06F 17/50* (2006.01)
  *H01L 27/144* (2006.01)
  *H01L 31/0232* (2014.01)
  *G02F 1/015* (2006.01)

(52) U.S. Cl.
  CPC .............. *G01J 3/0259* (2013.01); *G01J 3/42* (2013.01); *G02B 6/29341* (2013.01); *G02F 1/01708* (2013.01); *G06F 17/5045* (2013.01); *H01L 27/1446* (2013.01); *H01L 31/02325* (2013.01); *G02F 2001/0155* (2013.01)

(58) Field of Classification Search
  CPC ... H01L 2924/12041; H01L 2924/0002; H01L 31/02327; H01L 51/0005; H01L 51/424
  See application file for complete search history.

(56) References Cited

U.S. PATENT DOCUMENTS

| | | |
|---|---|---|
| 2001/0004411 A1 | 6/2001 | Yariv |
| 2002/0122615 A1 | 9/2002 | Painter et al. |
| 2005/0135721 A1 | 6/2005 | Painter et al. |
| 2005/0135764 A1 | 6/2005 | Painter et al. |
| 2005/0207699 A1 | 9/2005 | Painter et al. |
| 2006/0039653 A1 | 2/2006 | Painter et al. |
| 2009/0220228 A1 | 9/2009 | Popovic |
| 2011/0273709 A1 | 11/2011 | Sweeney |

FOREIGN PATENT DOCUMENTS

| | | |
|---|---|---|
| WO | WO 2007/014218 A2 | 2/2007 |
| WO | 2010128325 A1 | 11/2010 |

OTHER PUBLICATIONS

Written Opinion (PCT/ISA/237) dated Jan. 16, 2013, by the European Patent Office as the Written Searching Authority for International Application No. PCT/EP2012/069956.
International Search Report (PCT/ISA/210) dated Mar. 13, 2013, by the European Patent Office as the International Searching Authority for International Application No. PCT/EP2012/069934.
Written Opinion (PCT/ISA/237) dated Mar. 13, 2013, by the European Patent Office as the International Searching Authority for International Application No. PCT/EP2012/069934.
International Search Report (PCT/ISA/210) dated Jan. 4, 2013, by the European Patent Office as the International Searching Authority for International Application No. PCT/EP2012/069928.
Written Opinion (PCT/ISA/237) dated Jan. 4, 2013, by the European Patent Office as the International Searching Authority for International Application No. PCT/EP2012/069928.
International Search Report (PCT/ISA/210) dated Jan. 7, 2013, by the European Patent Office as the International Searching Authority for International Application No. PCT/EP2012/069957.
Written Opinion (PCT/ISA/237) dated Jan. 7, 2013, by the European Patent Office as the International Searching Authority for International Application No. PCT/EP2012/069957.
International Search Report (PCT/ISA/210) dated Mar. 13, 2013, by the European Patent Office as the International Searching Authority for International Application No. PCT/EP2012/069935.
Written Opinion (PCT/ISA/237) dated Mar. 13, 2013, by the European Patent Office as the International Searching Authority for International Application No. PCT/EP2012/069935.
Notification Concerning Transmittal of International Preliminary Report on Patentability (Chapter I of the Patent Cooperation)(Form PCT/IB/326 & Form PCT/IB/373) and the Written Opinion of the International Searching Authority (Translation)(Form PCT/ISA/237) dated Apr. 24, 2014, in the corresponding International Application No. PCT/EP2012/069934. (11 pages).
Office Action (Third Office Action) dated Feb. 5, 2018, by the Chinese Patent Office in corresponding Chinese Patent Application No. 201280061774.4, and an English Translation of the Office Action which we received dated Jun. 19, 2018. (20 pages).
Office Action (Third Office Action) dated Feb. 5, 2018, by the Chinese Patent Office in corresponding Chinese Patent Application No. 201280061774.4, and an English Translation of the Office Action. (22 pages).

DEVICE WITH A QUANTUM WELL LAYER

FIELD OF THE INVENTION

The present invention relates to a device for guiding and absorbing electromagnetic radiation. In particular, the invention relates to a structure comprising a quantum-well layer.

BACKGROUND OF THE INVENTION

Spectrometers are used in many applications for measuring properties of light across a range of wavelengths. For example, a spectrometer can be used for compositional analysis, by obtaining absorption or emission spectra for an object of interest. The presence and location of peaks within the spectra can indicate the presence of particular elements or compounds. Spectrometers are commonly used for analysis at optical wavelengths, but can also be used at other wavelengths such as microwave and radio wavelengths.

Spectrometers are typically relatively complex and expensive devices that require the alignment of a number of moving parts to be controlled with high precision. For example, a typical spectrometer may focus light onto a diffraction grating to split an incident beam into separate wavelengths, and the diffraction grating may be rotated to a specific angle to direct light of a particular wavelength towards a detector. In recent years chip-based spectrometers have been developed which can be highly miniaturised, have no moving parts, and can be manufactured using well-established lithography techniques.

A typical chip spectrometer, which may also be referred to as a spectrometer-on-a-chip, comprises a substrate onto which are patterned a waveguide and a plurality of disk resonators coupled to the waveguide. The waveguide guides the input light to the disk resonators. Light is input to one end of the waveguide, and each resonator is arranged to support a resonant mode at a particular wavelength such that only light of that wavelength is coupled into the resonator. On top of each disk resonator is an electrode for detecting current that is proportional to the amount of light present in that resonator. The current detected in each resonator therefore indicates the amount of light at that wavelength that was present in the input beam of light. Each electrode is further connected to a signal bond pad for connecting the spectrometer to an external device for measuring the current. To ensure that light input to the waveguide is absorbed by the disk resonators and not by the waveguide, the disk resonators and waveguide have to be constructed to have different properties, for example by ensuring that the semiconductor band gap in the waveguide is higher than the band gap in the disk resonators. The need for different band gaps adds to manufacturing complexity due to the fact that additional epitaxial re-growth and processing steps are required.

SUMMARY OF THE INVENTION

According to the invention, there is provided a device for guiding and absorbing electromagnetic radiation, the device comprising: absorbing means for absorbing the electromagnetic radiation; a waveguide coupled to the absorbing means for guiding the electromagnetic radiation to the absorbing means, wherein the waveguide and the absorbing means are formed from a structure comprising a first cladding layer, a second cladding layer over the first cladding layer, and a quantum-well layer between the first and second cladding layers, the quantum-well layer being formed of a material having a different composition to the first and second cladding layers, wherein the thickness and the composition of the quantum-well layer is optimised to provide an acceptable level of absorption of electromagnetic radiation in the waveguide while providing an appropriate band gap for absorption of the electromagnetic radiation in the absorbing means.

The absorbing means may be any absorbing structure, layer or component. For example, it may form part of a detector for detecting radiation.

The absorbing means may comprise at least one resonator, each or the at least one resonators being resonant at a predetermined wavelength of the electromagnetic radiation. The device may comprise a substrate and the resonators and the waveguide may be provided on the substrate. Ideally, to minimise losses, it is desired to avoid an absorption layer in the waveguide. However, it is difficult to manufacture devices with materials of different compositions in the absorbing means and the waveguide. According to the invention, the quantum-well absorbing layer is provided in both absorbing means and the waveguide. When the absorbing means comprises resonators, the quantum-well is provided in each of the resonators and the waveguide. By using a quantum well layer, the degree of absorption in the waveguide and the resonators can be controlled and a greater control over the band gap of the absorbing layer is provided.

The acceptable level of absorption in the waveguide may be a minimum level of absorption obtainable within a predetermined range of thicknesses and compositions of the quantum-well layer, such that the thickness and composition of the quantum-well are optimised to minimise absorption in the waveguide.

The quantum-well layer may have a thickness that is substantially less than a thickness of the waveguide.

The thickness and the composition of the quantum well may be configured to provide a desired quantum well ground state transition energy while maximising a quality factor (Q) of resonance of the resonators and keeping the strain within the active layer lower than a maximum suitable value. The maximum suitable value may be 1.5%.

The device may be a spectrometer. The quantum-well layer may be formed of a material having a band-gap that is less than or equal to a predetermined energy, the predetermined energy corresponding to a maximum wavelength $\lambda_{max}$ of electromagnetic radiation that the spectrometer is configured to detect. The resonators may be disk resonators.

The resonators may have a minimum free-spectral range FSR value corresponding to a wavelength interval $\Delta\lambda$ and the quantum well layer may be configured to have a composition and thickness providing a ground state transition energy corresponding to the energy of radiation at a wavelength $\lambda_{max}+\Delta\lambda$.

According to the invention, there is also provided a method of optimising a layer thickness and composition of a quantum-well layer for a device for guiding and absorbing electromagnetic radiation, the device comprising absorbing means for absorbing the electromagnetic radiation and a waveguide coupled to the absorbing means for guiding the electromagnetic radiation to the absorbing means, wherein the waveguide and the absorbing means are formed from a structure comprising a first cladding layer, a second cladding layer over the first cladding layer, and the quantum-well layer between the first and second cladding layers, the quantum-well layer being formed of a material having a different composition to the first and second cladding layers, the method comprising: determining an appropriate quantum well ground state transition energy for the quantum well for absorbing the electromagnetic radiation in the absorbing means; and determining the thickness and the composition of the quantum well that are configured to provide the desired ground state transition energy and provide an acceptable level of absorption in the waveguide.

The absorbing means and the waveguide may be provided on a substrate of the device. Moreover, the absorbing means may comprise at least one resonators, the or each of the at least one resonators being resonant at a predetermined wavelength of radiation. Determining the thickness and the composition of the quantum well may comprises determining the thickness and the composition that are configured to provide the desired ground state transition energy, while maximising a quality factor (Q) of resonance of the resonators and keeping the strain within the quantum-well layer lower than a predetermined acceptable limit.

Determining the thickness and the composition of the quantum well may comprise selecting an initial thickness and composition of the quantum-well layer from a predetermined range of thicknesses and compositions; determining a bend loss in the at least one resonator based on the initial thickness and composition; obtaining a value of a quality Q factor for the resonator, based on the bend loss; determining whether the obtained value of the Q factor is a maximum available value of the Q factor within the predetermined range of thicknesses and compositions; obtaining a value of strain in the quantum-well layer based on the selected thickness and composition; determining whether the obtained value of the strain is below a predetermined acceptable limit; and using the selected thickness and composition as the final thickness and composition of the quantum-well layer, if it is determined that the value of the Q factor is a maximum available value, and if the obtained strain is below the predetermined acceptable limit.

The method may further comprise, if it is determined that the value of Q for the initial composition and thickness is not a maximum value or if the obtained strain is not below the predetermined acceptable limit, adjusting the initial thickness and composition to obtain a new thickness and composition and repeating the steps of obtaining a bend loss, determining a Q factor value, determining whether the obtained value is a maximum, obtaining a strain value and determining whether the obtained strain value is below a predetermined acceptable limit for the new thickness and composition. The predetermined acceptable limit for the strain may be 1.5%.

The initial composition and thickness may be selected based on a target value of a band gap for the quantum-well layer. The at least one resonators may have a minimum free-spectral range FSR value and the method may further comprise: obtaining a wavelength difference value that is less than a minimum FSR value of the plurality of resonators; and obtaining the target value of the band gap by obtaining a value corresponding to the energy of radiation at a wavelength equal to the sum of the wavelength difference value and the predetermined wavelength.

BRIEF DESCRIPTION OF THE DRAWINGS

Embodiments of the present invention will now be described, by way of example only, with reference to the accompanying drawings, in which.

DETAILED DESCRIPTION

Figure 1:
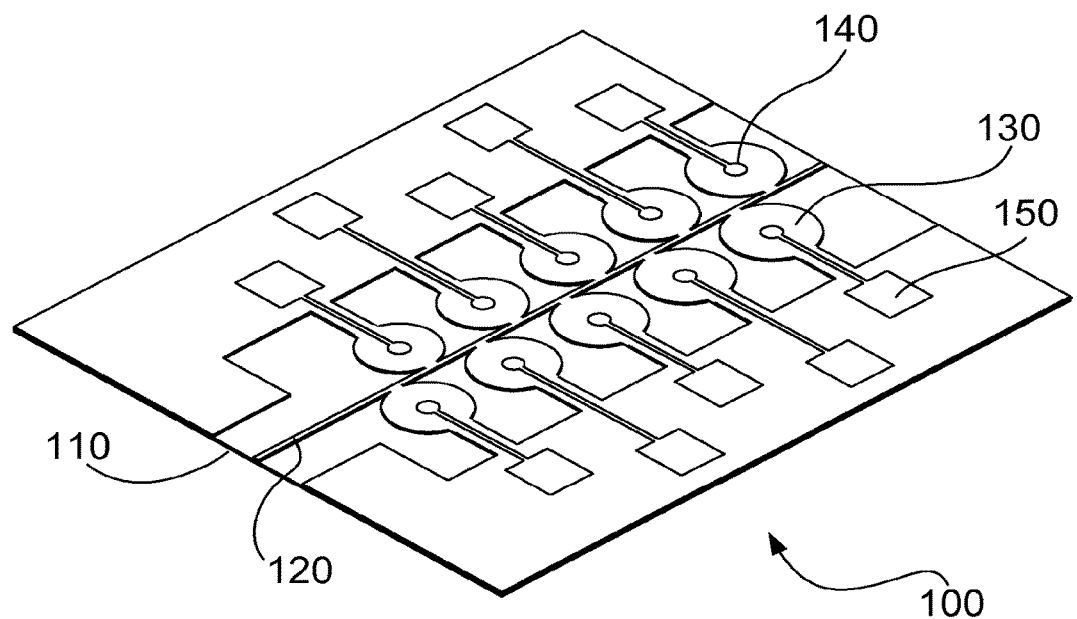
FIG. 1 illustrates a spectrometer according to an embodiment of the present invention.
Figure 2:
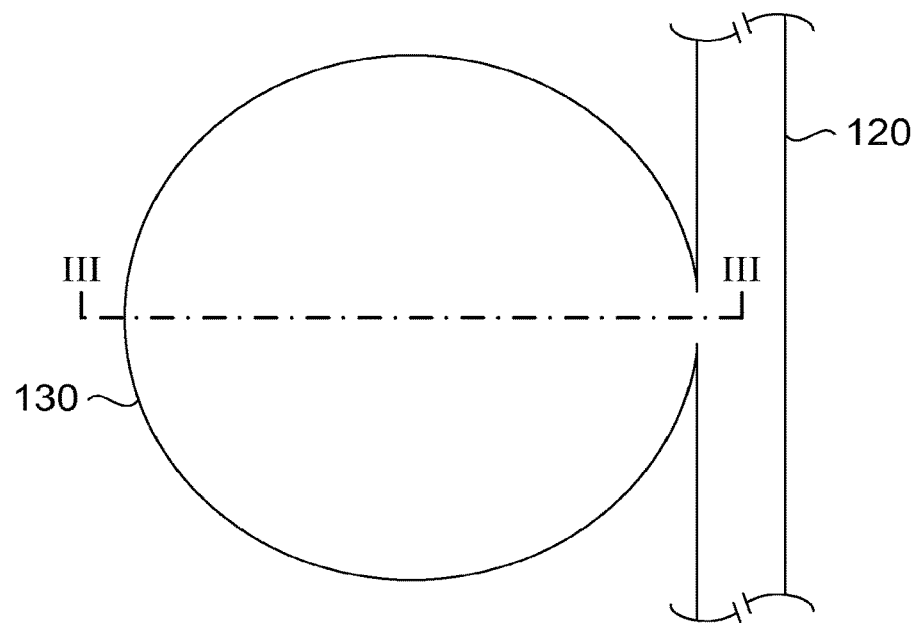
FIG. 2 illustrates a disk resonator and waveguide in the spectrometer of FIG. 1.
Figure 3:
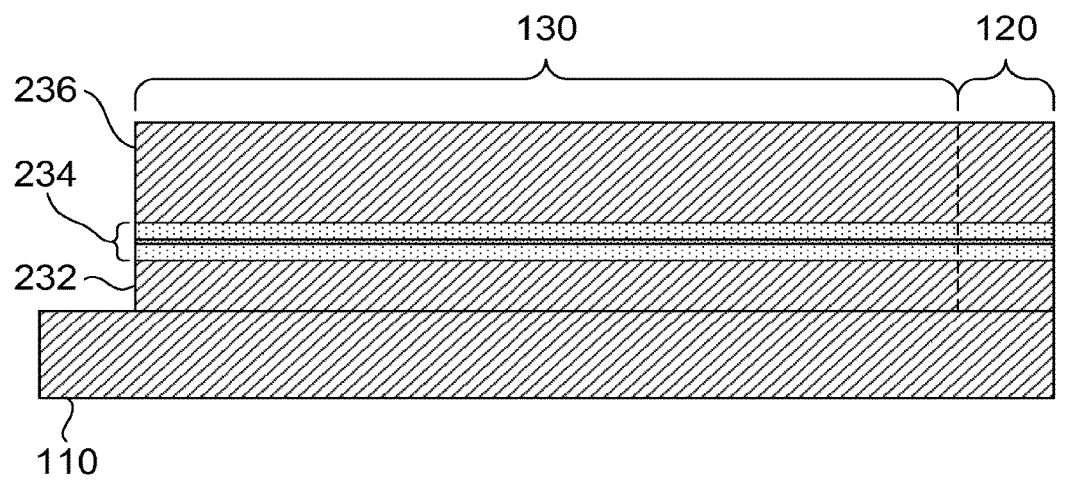
FIG. 3 illustrates a cross-section through the disk resonator and waveguide of FIG. 2.
Figure 4:
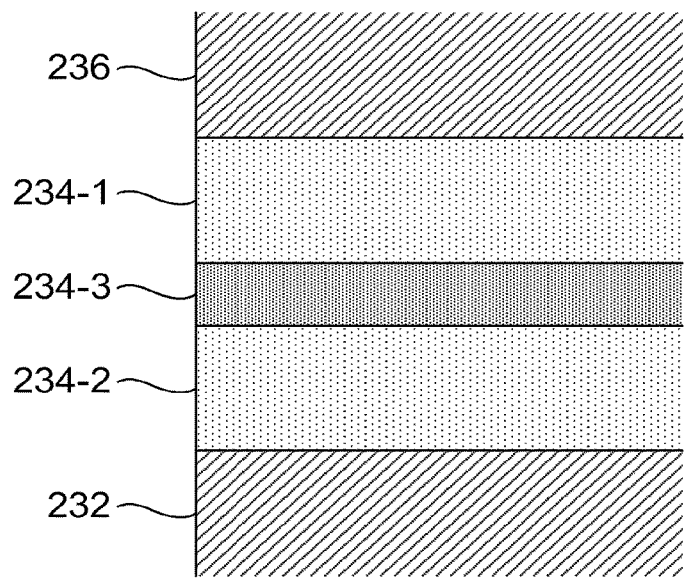
FIG. 4 illustrates the detailed structure of a quantum-well active layer in the disk resonator of FIG. 2.

Referring now to FIG. 1, a spectrometer-on-a-chip is illustrated according to an embodiment of the present invention. The spectrometer 100 comprises a substrate 110, elongate waveguide 120, and a plurality of disk resonators 130 coupled to the waveguide 120. The waveguide 120 may be a ridge waveguide. Each disk resonator 130 is provided with an electrode 140 for sensing a current in the disk resonator, the electrode 140 being connected to a bond pad 150 for connecting the spectrometer 100 to other components. One of the disk resonators 130 is shown in plan view in FIG. 2, and FIG. 3 shows a cross-section along the line III-III of FIG. 2. FIG. 4 illustrates in detail the structure of the active layer shown in FIG. 3. The drawings are schematic, and provided for illustrative purposes only. In particular, other layers and components may be present, but have been omitted in the drawings for clarity. For instance, additional layers of metallisation may be deposited above and below the disk resonator as electrical contacts, to measure a current flowing in the disk resonator that is representative of the amount of light energy currently being coupled into the resonator.

Like the conventional chip-based spectrometer, in the present embodiment the elongate waveguide 120 is coupled to the disk resonator 130 to guide input light to the disk resonator 130. The disk resonator 130 is configured to support a resonant mode at a particular predetermined wavelength of light, such that only light of the predetermined wavelength is coupled from the waveguide 120 into the disk resonator 130.

In the present embodiment the disk resonator and the waveguide have a multilayer structure including a support layer 232, an active layer stack 234, and a capping layer 236. The active layer stack 234 is arranged such that it can be located in both the waveguide 120 and the disk resonators 130 and provide an appropriate band gap for absorbing the radiation in the disk resonators while still allowing the light to be guided with low losses in the waveguide. The substrate is formed from InP that is n-doped with a dopant concentration of about $1-3\times10^{18}$ cm$^{-3}$. The support layer 232 is also formed from n-doped InP, having a dopant concentration of about $4-6\times10^{17}$ cm$^{-3}$. The active layer stack 234 may be formed from undoped InGaAsP. The capping layer 236 is formed from p-doped InP, having a dopant concentration of about $2\times10^{18}$ cm$^{-3}$. The present invention is not limited to these materials however, and in other embodiments other materials may be used.

The active layer stack 234 is shown in more detail in FIG. 4, and includes an upper cladding layer 234-1 and a lower cladding layer 234-2, which in the present embodiment are each 0.2485 µm thick and are formed from undoped InGaAsP. A 3 nm thick quantum-well active layer 234-3 is deposited between the upper and lower cladding layers 234-1, 234-2. The quantum well has a smaller band gap than the cladding layers. The quantum-well layer may also be formed from undoped InGaAsP but with a different composition to provide a smaller band gap than the cladding layers. The cladding layers 234-1, 234-2 may both be formed from the same material, or from different materials, and are arranged to have a high refractive index contrast compared with the support 232 and capping layers 236, such that the waveguide is formed by the interface between the cladding layers 234-1, 243-2 and the support and capping layers. Since the light is guided through the cladding layers 243-1, 234-2, and the quantum well 243-3 is sandwiched between the cladding layers, the light will also travel through the quantum well. That is, in the present embodiment the cladding layers 234-1, 234-2 ensure that input light waves overlap strongly with the quantum-well active layer 234-3, in both the disk resonators 130 and waveguide 120. Putting the quantum well in the centre of the cladding layers ensures that the overlap with the quantum well is maximised. The quantum well is itself is sufficiently thin to have little or no influence on the optical field in the waveguide 120. The thickness of the quantum-well active layer 234-3 is substantially less than the thickness of the waveguide 120, and modal losses in the waveguide 120 are minimised. Also, the reduced thickness of the quantum-well active layer 234-3 reduces the density of electronic states from three-dimensional to two-dimensional, reducing the absorption coefficient. This reduces absorption of light energy by the quantum-well active layer 234-3 in the waveguide 120, allowing the quantum-well active layer 234-3 to be uniformly deposited when the waveguide 120 and disk resonators 130 are formed. At the same time, once light is coupled into a disk resonator 130, because the light undergoes multiple cycles around the resonator in the quantum well with only a weak coupling out of the disk resonator 130, the light is ultimately absorbed by the quantum-well active layer 234-3 even though the absorption coefficient is reduced in the quantum well compared to a thicker layer. The waveguide ensures that the optical field is at a maximum over the quantum well which helps to increase absorption.

It should be realised that the active stack layers can be designed such that only the quantum well and not the cladding layers absorbs the radiation. In general, the capping layer 236, the support layer 232 and the cladding layers may have band gaps that are greater than the highest-energy photon of interest, i.e. greater than the energy of a photon at the shortest wavelength that the spectrometer is configured to detect. In contrast, the quantum-well active layer 234-3 may have a band gap that is less than the lowest-energy photon of interest, i.e. lower than the energy of a photon at the longest wavelength that the spectrometer is configured to detect. In this way, the light in each of the resonators 130 can be absorbed by the quantum-well active layer 234-3. Also, the same composition of the quantum-well active layer 234-3 can be used in all disk resonators in the spectrometer, simplifying the manufacturing process. Specifically, when light of the predetermined wavelength enters the resonator 130 from the waveguide 120, the photons can be absorbed by the material in the quantum-well active layer 234-3 as the band gap is low enough for even the lowest-energy photons to excite electrons from the valence band into the conduction band, generating electron-hole pairs. The resulting current can be measured, and is proportional to the amount of light energy in the disk resonator 130. Accordingly, the quantum-well active layer 234-3 in the disk resonator 130 can be used to detect and measure an amount of light energy present at the predetermined wavelength in a light beam that is input to the waveguide 120.

Since an active stack layer can be optimised to guide light with low losses in the waveguide but still absorb the light in the resonators, the waveguide 120 and disk resonators 130 can be formed in a single epitaxial step. The active stack layer of the waveguide and the disk resonators may be integrally formed as a single structure. In contrast, in a conventional spectrometer-on-a-chip, an absorbing layer in the waveguide has to be selectively etched and replaced by a wider band-gap alloy, or the absorbing layer has to be only deposited in the disk resonators in the first place. Embodiments of the present invention can therefore offer a simplified manufacturing process, since the quantum-well active layer 234-3 can be deposited and retained in both the waveguide and disk resonators.

It should be realised that the present invention is not limited to the layer structure shown in FIGS. 3 and 4, and in other embodiments other structures may be used. The structure may include additional layers or fewer layers. The described layer thicknesses and materials are only exemplary, and in other embodiments other thicknesses and materials may be used.

Figure 5:
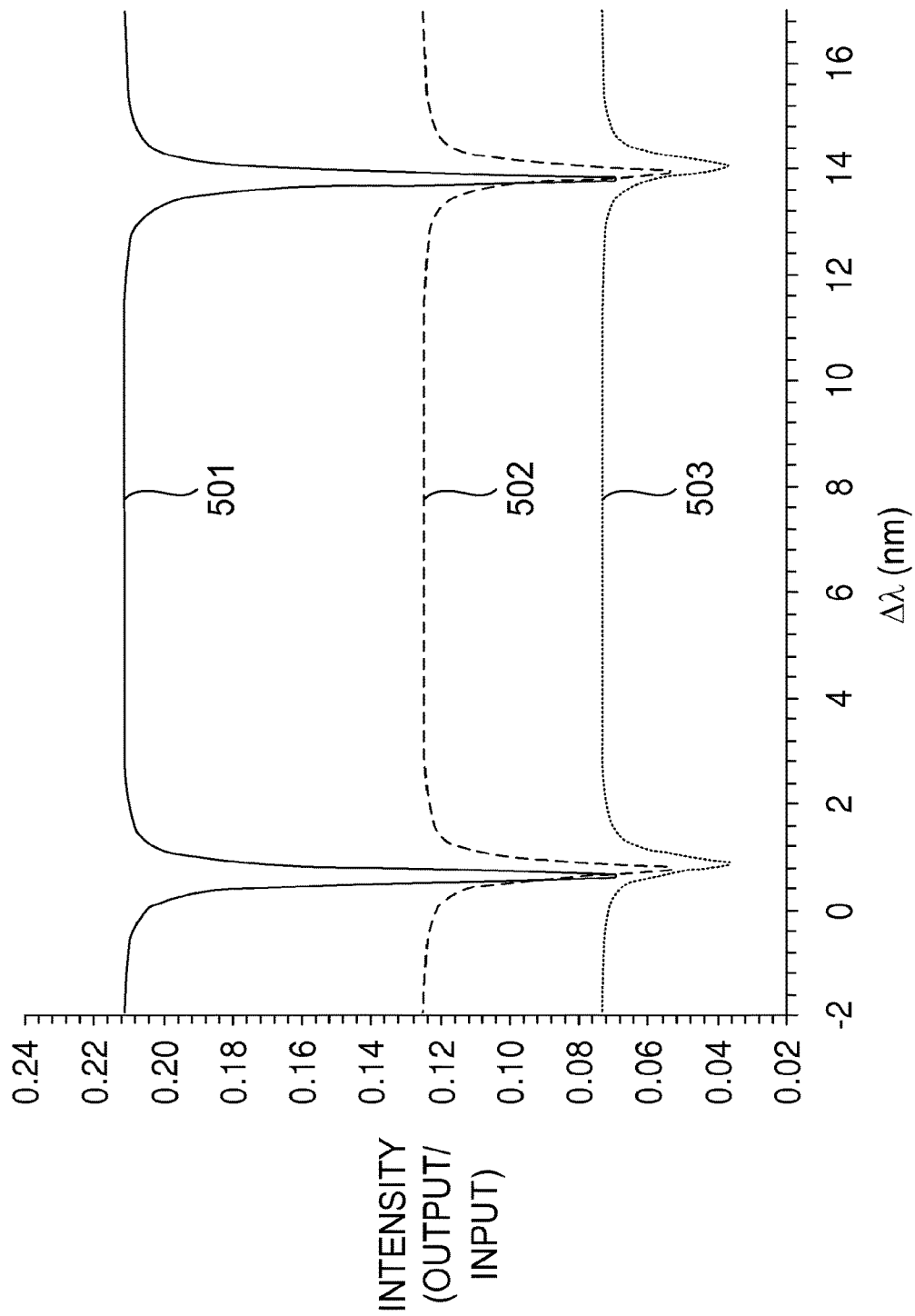
FIG. 5 is a graph showing how losses in the disk resonator of FIG. 2 are affected by the active layer thickness, according to embodiments of the present invention.

Referring now to FIG. 5, a graph is shown illustrating the effect of varying the thickness of the quantum-well active layer 234-3 on losses in the waveguide. In the three embodiments for which curves are shown in FIG. 5, a waveguide length of 1000 μm is used and the spectrometer is configured to receive input light with a centre wavelength, i.e. a median wavelength, of 1.6 μm. In FIG. 5, the intensity is plotted against wavelength for light input into the waveguide. Here, intensity is measured as the ratio of output energy to input energy at particular wavelength, in the waveguide. A higher intensity indicates that a greater proportion of the input energy is still present at the end of the waveguide, i.e. has not been absorbed by the quantum-well active layer in the waveguide. The dips in intensity around 1 and 14 nm correspond to light of wavelengths of 1 and 14 nm above the centre wavelength being coupled into disk resonators.

In a first embodiment, shown as a solid line 501 in FIG. 5, the quantum-well active layer has a thickness of 3 nm. In a second embodiment, shown as a dashed line 502 in FIG. 5, the quantum-well active layer has a thickness of 4 nm. In a third embodiment, shown as a dotted line 503 in FIG. 5, the quantum-well active layer has a thickness of 5 nm. In general, as shown in FIG. 5 the thinner the quantum-well active layer, the lower the losses in the waveguide. That is, for any given wavelength of light and any given material of the active layer, losses in the waveguide will be lower for a thinner quantum-well active layer. Therefore preferably the quantum-well active layer is formed with the smallest thickness that is practical to manufacture in a uniform manner.

Figure 6:
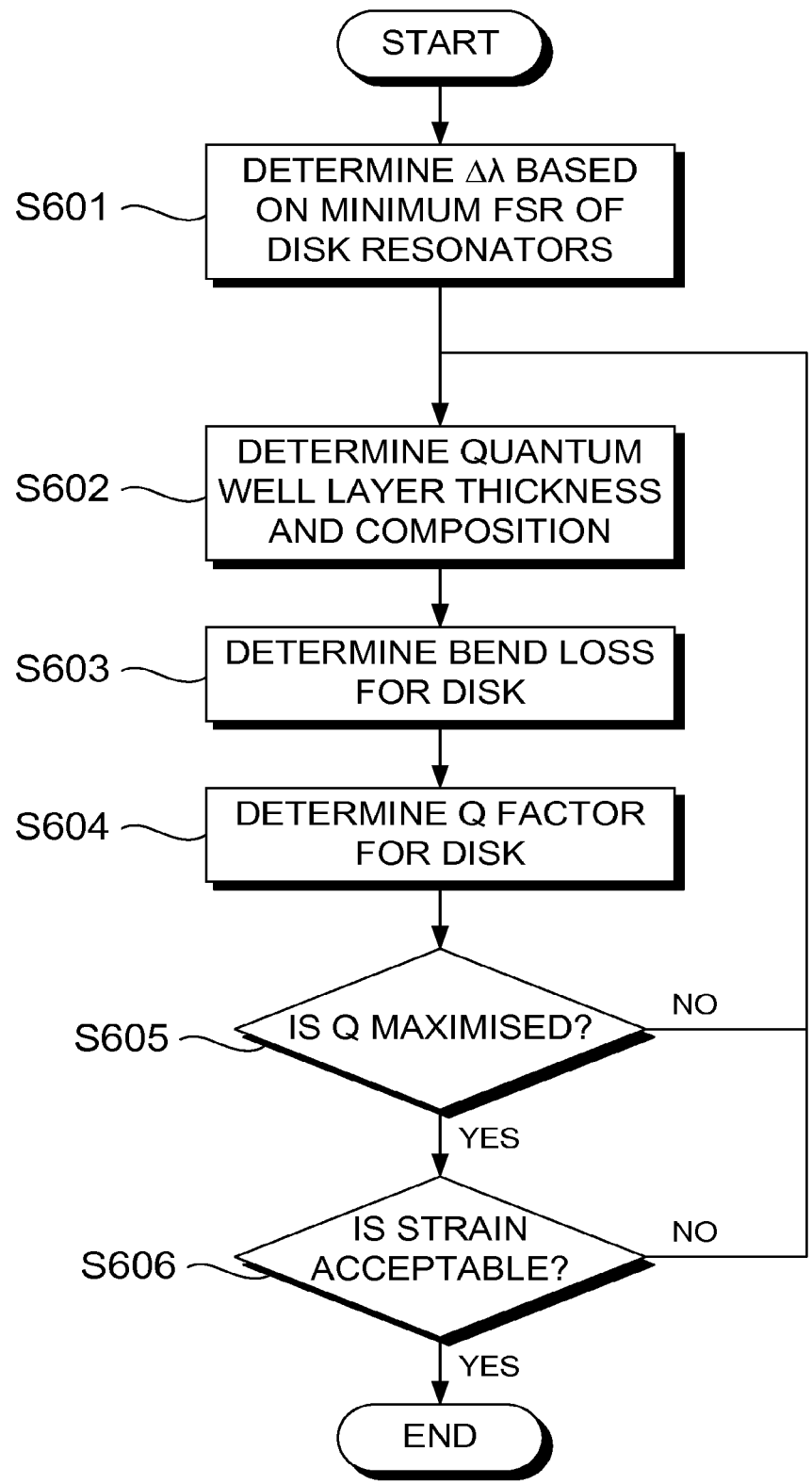
FIG. 6 is a flowchart showing a process of selecting a suitable composition and layer thickness for the quantum-well active layer, according to an embodiment of the present invention.

Referring now to FIG. 6, a process is illustrated for optimising a layer thickness and composition for the quantum-well active layer, for a known maximum wavelength $\lambda_{max}$ max of interest, i.e. a maximum wavelength to be detected. The thickness and composition may chosen to provide a suitable band gap, to maximise the quality (Q) factors of the resonance for the disk resonators and to provide a fixed strain of less than 1.5% in the quantum well layer.

Firstly, in step S601, a wavelength offset $\lambda_{max}$ is determined. Each disk resonator supports resonance modes of different orders and the wavelength separation between these modes is referred to as the free-spectral range (FSR) value. The wavelength offset $\Delta\lambda$ is chosen to be less than the lowest free-spectral range of the plurality of disk resonators.

Next, in step S602, a starting thickness and composition are chosen for the quantum-well active layer to provide an initial desired band gap. The starting thickness and composition are chosen to provide a quantum well ground state transition energy at $hc/(\lambda_{max}+\Delta\lambda)$, where h is the Planck constant and c is the speed of light in the vacuum. That is, the initial target value of the band gap corresponds to the energy of radiation at a wavelength equal to the sum of the wavelength difference value $\Delta\lambda$ and the predetermined wavelength $\lambda_{max}$. The depth of the well is varied until the quantum well ground state energy matches the chosen value. However, other methods may be used to determine the starting thickness and composition in other embodiments. For example, a database may store approximate thicknesses and compositions suitable for a plurality of predetermined $\lambda$ and $\Delta\lambda$ values, and a starting thickness and composition may be chosen based on the values for the closest available $\lambda_{max}$ and $\Delta\lambda$ values to the actual values required in the present embodiment.

Next, in step S603, the bending loss for a disk resonator is determined based on the chosen starting thickness and composition for the quantum-well active layer. The bending loss of the resonators also depends on the size of the resonators. Then, in step S604, the Q factor of resonance for the disk resonator is determined. The Q factor is dependent on the bend loss obtained at step S603 but also on the level of absorption in the waveguide. In step S605, it is determined whether the Q factor has been maximised, or whether a higher Q is available. The Q factor is maximised when the absorption in the disk resonators is maximised and the absorption in the waveguide is minimised. The quantum well is designed to be thin in order to reduce overlap in the ridge waveguide and thereby minimise absorption in the waveguide. If the Q factor is not maximised, the process returns to step S602 and selects a different thickness and/or composition. There is only one maximum for the Q factor in the parameter space and the maximum can be found by an iterative procedure. For example, the thickness and/or composition may be varied by a predetermined amount from the starting values at each iteration.

If it is determined in step S605 that the Q factor is maximised for the currently selected thickness and composition, then in step S606 it is determined whether the strain in the quantum-well active layer is within acceptable limits. For example, the strain may be acceptable if it is less than 1.5%, although another limit may be used in other embodiments. The example of 1.5% is suitable for the materials mentioned above and it should be understood that the maximum acceptable strain value varies with the material used. The strain may depend on the in-plane lattice mismatch between the material of the quantum-well active layer and the materials of the substrate. As will be understood, the cladding layers are lattice-matched to the substrate. If the strain is not acceptable, the process returns to step S603 and selects a different thickness and/or composition. However, if the strain is acceptable, then the process is complete and the currently selected thickness and composition can be used when manufacturing the spectrometer.

It should be understood, that although a specific order for the processing steps of FIG. 6 has been described, the order can be varied. In general, the process for optimising the composition and thickness of the quantum well involves varying the composition and layer thickness of the quantum well to provide the same selected ground state energy while maximising Q and keeping the strain lower than a maximum suitable value. The ground state energy is chosen to be close the energy of the longest wavelength of interest.

Moreover, it should be realised that at least some of the parameters analysed in the process of FIG. 6 depends on the characteristics of the resonators. For example, the FSR and the bend loss depends on the size and order of the resonators.

In some embodiments, if the size of the resonators can be varied, the radii of each resonator can be optimised for a given thickness and composition of the quantum well. Changing the radii of the disk resonators may affect the bend loss and the FSR and therefore, after optimising the radii of each disk resonator, the method of FIG. 6 can be repeated for the new updated resonator sizes to determine whether to further adjust the thickness and composition of the quantum well. This can be an iterative process, involving repeatedly optimising the disk radii and ordering, optimising the absorbing layer composition and thickness, adjusting the disk radii and ordering for the new absorbing layer, and so on. The process may be repeated until a predetermined criteria is fulfilled, for example until acceptable losses are achieved or until the process has been repeated a certain number of times. In some embodiments each optimisation process could only be carried out once, or the absorbing layer optimisation may not be carried out at all.

Here, an acceptable loss in the waveguide may be the minimum loss that is obtainable within the given constraints, such as the available range of thicknesses and compositions, maximum suitable strain, and maximised Q value. Alternatively, an acceptable loss may not necessarily be the minimum achievable loss, but could be any loss below a predetermined maximum acceptable limit. For example, the process could stop once a thickness and composition has been identified that provides losses below the minimum acceptable limit, regardless of whether other thicknesses and/or compositions exist that offer even lower losses, and in the event that the predetermined acceptable limit cannot be obtained within the given constraints, then the thickness and composition giving the lowest loss amongst the predetermined range of thicknesses and compositions can be selected.

Whilst certain embodiments of the present invention have been described above, the skilled person will understand that many variations and modifications are possible without departing from the scope of the invention as defined in the accompanying claims.

For example, it will be appreciated that the spectrometer, with respect to which embodiments of the invention have been described, may be considered to be, or form part of, a spectrophotometer. Therefore, where the term "spectrometer" has been used, the term can be replaced with the term "spectrophotometer".

Moreover, although the spectrometer has been described in places to receive and guide light, the spectrometer may be used to guide and detect electromagnetic radiation of any wavelength. Additionally, although the spectrometer has been described to comprise disk resonators, the described waveguide may be used to guide light into a different type of resonator. For example, the resonators may be any high Q cavities, such as spherical resonators, microrings etc.

Additionally, although certain embodiments of the present invention have been described in relation to a spectrometer-on-a-chip, the quantum-well active layer may also be used in other devices to minimise losses in a light guiding section while allowing radiation to be absorbed in an absorbing section of the structure. For example, in other embodiments the quantum-well active layer may be included in devices such as photonic integrated circuits, optical sensors and system, and optical communications devices, such as add-drop multiplexers. The waveguide may guide the radiation to any type of detector providing absorption means and the device does not have to include resonators. In general, and as described above with reference to FIG. 4, the absorption means is arranged to detect a predetermined wavelength of electromagnetic radiation, and the quantum well thickness and composition should provide an appropriate band gap to ensure that electromagnetic radiation of the predetermined wavelength can be absorbed in the absorbing means and detected. Here, an appropriate band gap will be any gap that is less than or equal to the energy of a photon at the predetermined wavelength.

The invention claimed is:

1. A method of optimising a layer thickness and composition of a quantum-well layer for a device for guiding and absorbing electromagnetic radiation, the device comprising a substrate; at least one resonator located on the substrate for absorbing the electromagnetic radiation, the or each of the at least one resonators being resonant at a predetermined wavelength of radiation; a waveguide on the substrate, the waveguide being coupled to the at least one resonator for guiding the electromagnetic radiation to the at least one resonator, wherein the waveguide and the at least one resonator are formed from a structure comprising a first cladding layer, a second cladding layer over the first cladding layer, and the quantum-well layer between the first and second cladding layers, the quantum-well layer being formed of a material having a different composition to the first and second cladding layers, the method comprising:

determining an appropriate quantum well ground state transition energy for the quantum-well layer for absorption of the electromagnetic radiation in the at least one resonator; and determining the thickness and the composition of the quantum well that are configured to provide the desired ground state transition energy and provide an acceptable level of absorption in the waveguide, while maximizing a quality Q factor of resonance of the at least one resonator and keeping the strain within the quantum-well layer lower than a predetermined limit, wherein determining the thickness and the composition of the quantum well comprises:

selecting an initial thickness and composition of the quantum-well layer from a predetermined range of thicknesses and compositions;

determining a bend loss in the at least one resonators based on the initial thickness and composition;

obtaining a value of the Q factor for the resonator, based on the bend loss;

determining whether the obtained value of the Q factor is a maximum available value of the Q factor within the predetermined range of thicknesses and compositions;

obtaining a value of strain in the quantum-well layer based on the selected thickness and composition;

determining whether the obtained value of the strain is below the predetermined acceptable limit; and using the selected thickness and composition as the final thickness and composition of the quantum-well layer, if it is determined that the value of the Q factor is a maximum available value, and if the obtained strain is below the predetermined acceptable limit.

2. The method of claim 1, wherein the predetermined acceptable limit is 1.5%.

3. The method of claim 1, further comprising, if it is determined that the value of the Q factor for the initial thickness and composition is not a maximum value or if the obtained strain is not below the predetermined acceptable limit, adjusting the initial thickness and composition to obtain a new thickness and composition and repeating the steps of obtaining a bend loss, determining a Q factor value, determining whether the obtained value is a maximum, obtaining a strain value and determining whether the obtained strain value is below a predetermined acceptable limit for the new thickness and composition.

4. The method of claim 3, wherein the initial thickness and composition are selected based on a target value of a band gap for the quantum-well layer.

5. The method of claim 4, wherein the at least one resonator has a minimum free-spectral range FSR value, the method further comprising:

obtaining a wavelength difference value that is less than a minimum FSR value of the plurality of resonators; and obtaining the target value of the band gap by obtaining a value corresponding to the energy of radiation at a wavelength equal to the sum of the wavelength difference value and the predetermined wavelength.

6. The method of claim 1, wherein the acceptable level of absorption in the waveguide is a minimum level of absorption obtainable within a predetermined range of thicknesses and compositions of the quantum-well layer, such that the thickness and composition of the quantum-well is optimised to minimise absorption in the waveguide.

7. The method of claim 1, wherein the thickness of the quantum-well layer is determined to be substantially less than a thickness of the waveguide.

8. The method of claim 1, wherein the device is a spectrometer.

9. The method of claim 8, wherein the thickness and the composition of the quantum well are determined so as provide a band-gap that is less than or equal to a predetermined energy, the predetermined energy corresponding to a maximum wavelength $\lambda_{max}$ of electromagnetic radiation that the spectrometer is configured to detect.

* * * * *